United States Patent
Tanaka

(10) Patent No.: US 8,089,092 B2
(45) Date of Patent: Jan. 3, 2012

(54) SEMICONDUCTOR LIGHT EMITTING DEVICE

(75) Inventor: Yasushi Tanaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/593,826

(22) PCT Filed: Mar. 25, 2008

(86) PCT No.: PCT/JP2008/055500
§ 371 (c)(1),
(2), (4) Date: Sep. 29, 2009

(87) PCT Pub. No.: WO2008/120606
PCT Pub. Date: Oct. 9, 2008

(65) Prior Publication Data
US 2010/0044747 A1    Feb. 25, 2010

(30) Foreign Application Priority Data

Mar. 30, 2007  (JP) ................ 2007-092878

(51) Int. Cl.
*H01L 33/38* (2010.01)
(52) U.S. Cl. .................. 257/99; 257/E33.062
(58) Field of Classification Search .......... 257/99, 257/E33.056, E33.062, E33.066
See application file for complete search history.

(56) References Cited

U.S. PATENT DOCUMENTS

| | | | |
|---|---|---|---|
| 6,847,116 B2 * | 1/2005 | Isokawa | 257/736 |
| 6,989,596 B2 | 1/2006 | Inoue et al. | |
| 7,002,185 B2 | 2/2006 | Isokawa | |
| 2002/0105985 A1 * | 8/2002 | Inoue et al. | 372/45 |

FOREIGN PATENT DOCUMENTS

| | | | | |
|---|---|---|---|---|
| JP | 10-50734 | | 2/1998 | |
| JP | 10-050734 | * | 2/1998 | 257/99 |
| JP | 11-168235 | * | 6/1999 | 257/99 |
| JP | 2001-196641 | | 7/2001 | |
| JP | 2002-158390 | | 5/2002 | |
| JP | 2004-146609 | | 5/2004 | |
| TW | 200308105 | | 12/2003 | |

* cited by examiner

*Primary Examiner* — Colleen Matthews
(74) *Attorney, Agent, or Firm* — Hamre, Schumann, Mueller & Larson, P.C.

(57) ABSTRACT

A semiconductor light emitting device (A1) includes a substrate (1) and two electrodes (2A, 2B) formed on the substrate (1). The electrode (2A) is formed with a die bonding pad (2Aa), to which an LED chip (3) is bonded by silver paste (6). The outer edge of the die bonding pad (2Aa) is positioned on the inner side of the outer edge of the LED chip (3) as viewed in the thickness direction of the substrate (1). The electrode (2A) is formed with an extension (21) extending from the die bonding pad (2Aa) to the outside of the LED chip (3).

11 Claims, 3 Drawing Sheets

SEMICONDUCTOR LIGHT EMITTING DEVICE

TECHNICAL FIELD

The present invention relates to a semiconductor light emitting device used as e.g. the light source of a cell phone. The present invention also relates to a method for making such a semiconductor light emitting device.

BACKGROUND ART

FIG. 5 illustrates an example of a conventional semiconductor light emitting device (see e.g. Patent Document 1). The semiconductor light emitting device X illustrated in the figure includes a substrate 91 formed with a pair of electrodes 92A and 92B, and an LED chip 93 bonded to the substrate. The LED chip 93 and a bonding wire 94 are covered with a resin package 95. The electrode 92A includes a die bonding pad 92A$a$. The LED chip 93 is bonded to the die bonding pad 92A$a$ by silver paste 96. The electrode 92B includes a bonding pad 92B$a$ to which the bonding wire 94 is bonded.

Nowadays, there is a demand for a reduction in the size or thickness of cell phones. Accordingly, there is also a demand for a reduction in the thickness of semiconductor light emitting devices, which are the component parts of cell phones. As a means to achieve the thickness reduction of the semiconductor light emitting device X, it may be considered to reduce the thickness of the LED chip 93. However, when a thin LED chip 93 is employed in this structure, the silver paste 96 may rise onto the upper surface of the LED chip 93 in bonding the LED chip 93 onto the die bonding pad 92A$a$. In this case, a short-circuit occurs between the electrode 92A and the bonding wire 94.

Patent Document 1: JP-A-2001-196641

DISCLOSURE OF THE INVENTION

The present invention has been proposed under the circumstances described above. It is, therefore, an object of the present invention to provide a semiconductor light emitting device suitable for achieving thickness reduction.

A semiconductor light emitting device provided according to the present invention includes a substrate, an electrode formed on the substrate, and a semiconductor light emitting element bonded, by electrically conductive paste, to a die bonding pad of the electrode. The outer edge of the die bonding pad is positioned on the inner side of the outer edge of the semiconductor light emitting element as viewed in the thickness direction of the substrate. The electrode is further formed with an extension extending from the die bonding pad outward of the semiconductor light emitting element.

With this arrangement, most part of the electrically conductive paste is kept between the die bonding pad and the semiconductor light emitting element. Since the die bonding pad does not include a portion projecting out of the semiconductor light emitting element, spreading of the electrically conductive paste out of the semiconductor light emitting element is suppressed. Even if a large amount of electrically conductive paste is applied, the excess electrically conductive paste spreads along the extension. Thus, the electrically conductive paste is prevented from rising onto the upper surface of the semiconductor light emitting element. Thus, it is possible to employ a relatively thin semiconductor light emitting element, which leads to the thickness reduction of the semiconductor light emitting device.

Preferably, the semiconductor light emitting element is rectangular. The extension extends in a diagonal direction of the semiconductor light emitting element and includes a strip portion connected to the die bonding pad and a wide portion connected to the end of the strip portion and having a width larger than a width of the strip portion. With this arrangement, when the electrically conductive paste spreads out of the semiconductor light emitting element, the electrically conductive paste spreads from a corner of the semiconductor light emitting element toward the extension. Thus, the electrically conductive paste is prevented from rising along the side surfaces of the semiconductor light emitting element. Further, with this arrangement, the electrically conductive paste spread to the extension is reliably kept at the wide portion. Thus, the further spreading of the electrically conductive paste along the substrate and the resulting short circuiting are prevented.

Preferably, the ratio of the thickness of the electrically conductive paste to the thickness of the semiconductor light emitting element is in a range of 1:5 to 1:15. With this arrangement, the thickness reduction of the semiconductor light emitting device is achieved owing to the sufficiently thin semiconductor light emitting element, while the electrically conductive paste is reliably prevented from rising onto the semiconductor light emitting element.

Other features and advantages of the present invention will become more apparent from the detailed description given below with reference to the accompanying drawings.

BEST MODE FOR CARRYING OUT THE INVENTION

Figure 1:
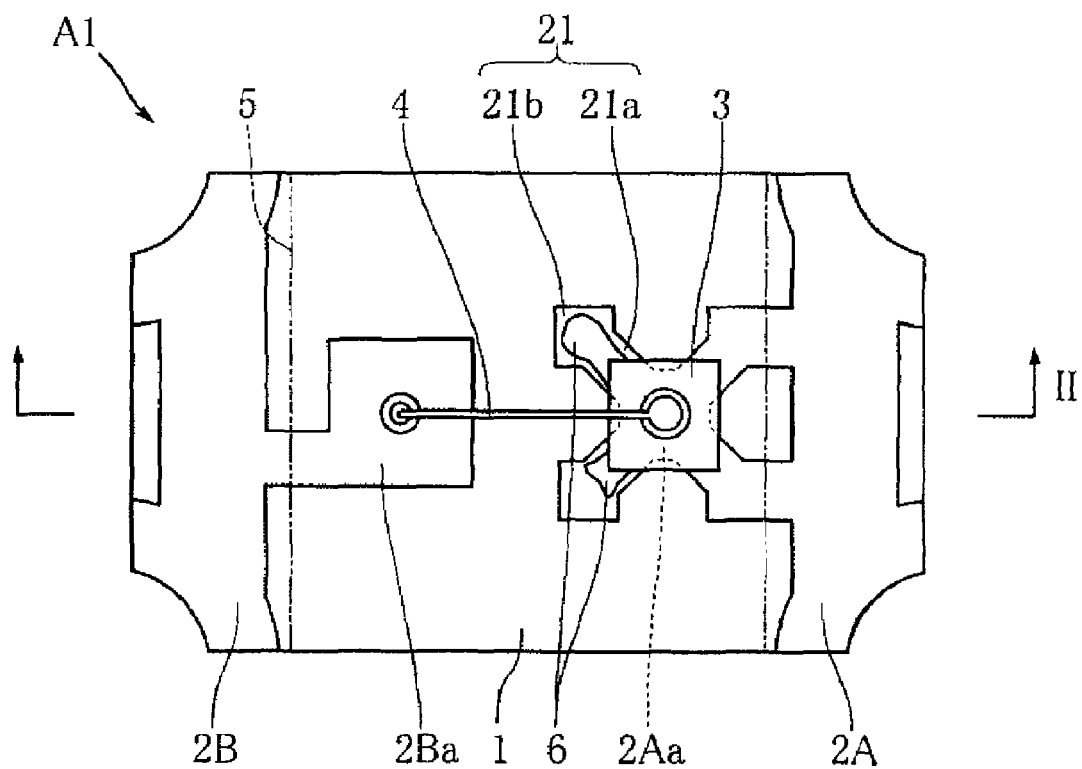
FIG. 1 is a plan view illustrating a semiconductor light emitting device according to a first embodiment of the present invention.
Figure 2:
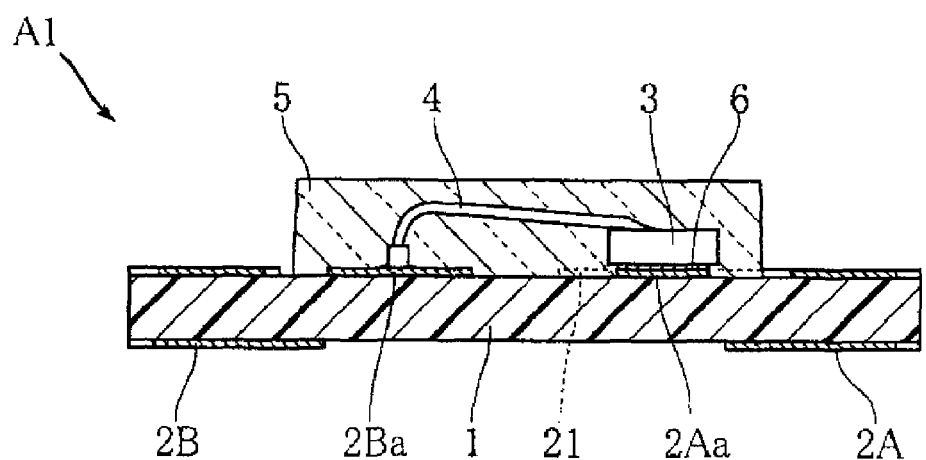
FIG. 2 is a sectional view taken along lines II-II in FIG. 1.
Figure 3:
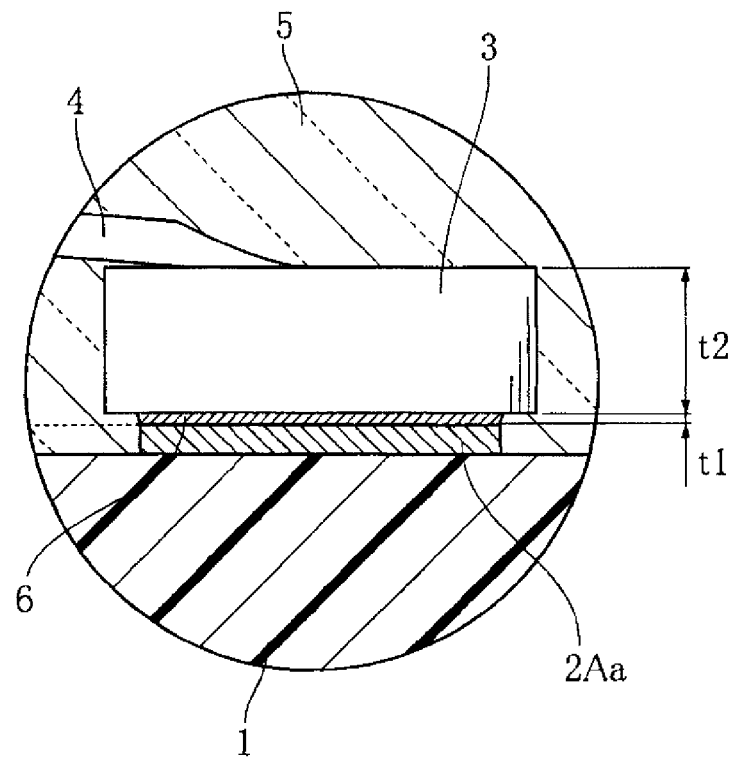
FIG. 3 is a sectional view illustrating a principal portion of the semiconductor light emitting device according to the first embodiment.

FIGS. 1-3 illustrate a semiconductor light emitting device according to a first embodiment of the present invention. The illustrated semiconductor light emitting device A1 includes a substrate 1, a pair of electrodes 2A and 2B, an LED chip 3, a bonding wire 4 and a resin package 5. For easier understanding, the resin package 5 is illustrated by phantom lines in FIG. 1. The semiconductor light emitting device A1 is a small and very thin device having a width of about 0.6 mm, a length of about 1.0 mm and a thickness of about 0.2 mm.

The substrate 1 is an insulating substrate made of e.g. a glass fiber-reinforced epoxy resin and substantially rectangular in plan view. The LED chip 3 is mounted to the obverse surface of the substrate 1. The reverse surface of the substrate 1 is used as a mounting surface in mounting the semiconductor light emitting device A1 to e.g. a circuit board. The four corners of the substrate 1 are formed with grooves extending in the thickness direction (vertical direction in FIG. 2). The substrate 1 has a thickness of e.g. about 0.08 to 0.1 mm.

The paired electrodes 2A and 2B are arranged at two ends of the substrate 1 to be spaced from each other via the center of the substrate 1. Each of the electrodes 2A and 2B extends from the obverse surface onto the reverse surface of the substrate 1 by way of the grooves. The portion of each of the electrodes 2A and 2B which covers the reverse surface of the substrate 1 is used as a mounting terminal for surface-mounting the semiconductor light emitting device A1. The electrodes 2A and 2B have a laminated structure made up of plating layers of e.g. Cu, Ni and Au.

The electrode 2A is formed with a die bonding pad 2Aa and four extensions 21. The LED chip 3 is bonded to the die bonding pad 2Aa by e.g. silver paste 6. The die bonding pad 2Aa is substantially square. The center of the die bonding pad 2Aa substantially corresponds to the center of the LED chip 3. The size of the die bonding pad 2Aa is smaller than that of the LED chip 3. Thus, as viewed in the thickness direction of the substrate 1, the outer edge of the die bonding pad 2Aa is positioned on the inner side of the outer edge of the LED chip 3 (see FIG. 1).

Each of the extensions 21 extends from the die bonding pad 2Aa in a diagonal direction of the LED chip 3 and includes a strip portion 21a and a wide portion 21b. The strip portion 21a is connected to the die bonding pad 2Aa and has a substantially constant width. The wide portion 21b is connected to the end of the strip portion 21 and has a maximum width that is larger than the width of the strip portion 21a. Although the wide portion 21b illustrated in the figure is in the shape of a rhombus, the wide portion may have other shapes such as a circular shape.

The electrode 2B is formed with a die bonding pad 2Ba. The bonding wire 4 is bonded to the die bonding pad 2Ba.

The LED chip 3 is the light source of the semiconductor light emitting device A1 and emits visible light. Specifically, the LED chip 3 may be a pn-type semiconductor light emitting element. The n-side electrode (not shown) formed on the bottom surface of the LED chip 3 is electrically connected to the electrode 2A by the silver paste 6. The p-side electrode (not shown) formed on the upper surface of the LED chip 3 is electrically connected to the electrode 2B by the bonding wire 4. The LED chip 3 is rectangular.

As illustrated in FIG. 3, the die bonding pad 2Aa and the LED chip 3 are bonded together by the silver paste 6. The ratio of the thickness t1 of the silver paste 6 to the thickness t2 of the LED chip 3 is in a range of 1:5 to 1:15. Specifically, the thickness t1 may be about 5 to 7 μm, whereas the thickness t2 may be about 40 to 75 μm, for example.

The resin package 5 protects the LED chip 3 and the bonding wire 4. The resin package 5 is made by molding a resin (e.g. epoxy resin) that transmits the light emitted from the LED chip 3. However, the entirety of the resin package 5 does not necessarily need to be made of a light transmitting material. For instance, the resin package may be provided with a reflector for reflecting the light emitted laterally from the LED chip 3 in the thickness direction of the substrate 1.

The advantages of the semiconductor light emitting device A1 will be described below.

As illustrated in FIG. 3, according to the first embodiment, most part of the silver paste 6 is kept between the die bonding pad 2Aa and the LED chip 3. Since the die bonding pad 2Aa does not include a portion projecting out of the LED chip 3, spreading of the silver paste 6 out of the LED chip 3 is suppressed. Even when a large amount of silver paste 6 is applied, the excess silver paste 6 spreads along the extensions 21, as illustrated in FIG. 1. Thus, the silver paste 6 is prevented from rising along the side surfaces of the LED chip 3, and hence, prevented from adhering to the bonding wire 4 connected to the upper surface of the LED chip. Thus, it is possible to employ an LED chip 3 having a relatively small thickness, which leads to the thickness reduction of the semiconductor light emitting device A1.

Further, even if the silver paste 6 spreads out of the LED chip 3, the silver paste 6 spreads from the corners of the LED chip 3 toward the extensions 21. Thus, the silver paste 6 does not rise along the side surfaces of the LED chip 3. The silver paste 6 spread to the extensions 21 is reliably kept at the wide portions 21b. Thus, the silver paste 6 is prevented from reaching the electrode 2B through the substrate 1.

When the ratio of the thickness t1 of the silver paste 6 to the thickness t2 of the LED chip 3 is in a range of 1:5 to 1:15, the thickness reduction of the semiconductor light emitting device A1 is achieved owing to the sufficiently thin LED chip 3, while the silver paste 6 is reliably prevented from rising onto the LED chip. When the ratio of t1 to t2 is smaller than 1:5, the silver paste 6 may rise onto the upper surface of the LED chip 3. Conversely, when the ratio of t1 to t2 is larger than 1:15, the silver paste 6 is too thin to properly bond the LED chip 3 or the LED chip 3 is too thick to achieve the thickness reduction of the semiconductor light emitting device A1.

Figure 4:
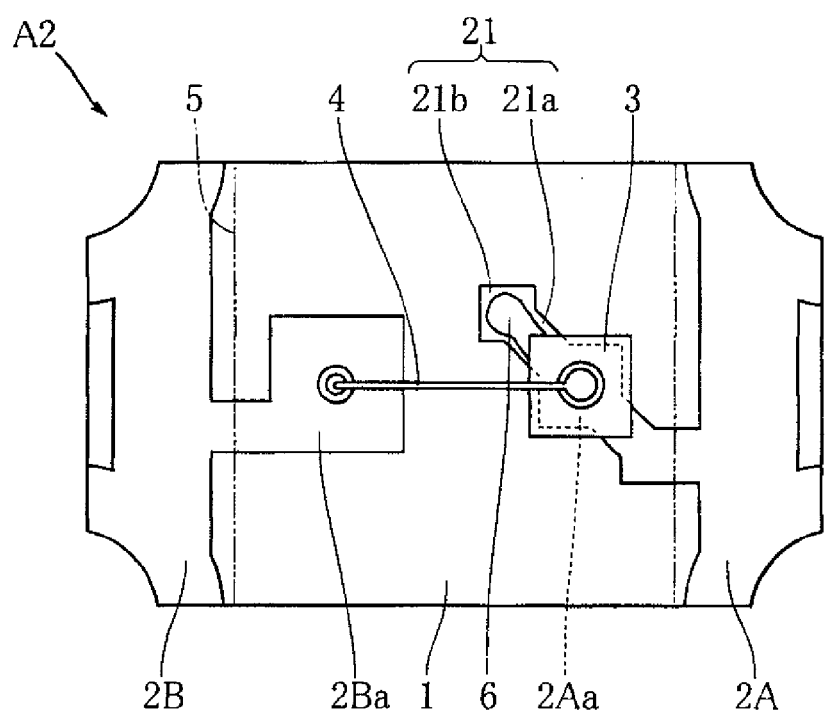
FIG. 4 is a plan view illustrating a semiconductor light emitting device according to a second embodiment of the present invention.
Figure 5:
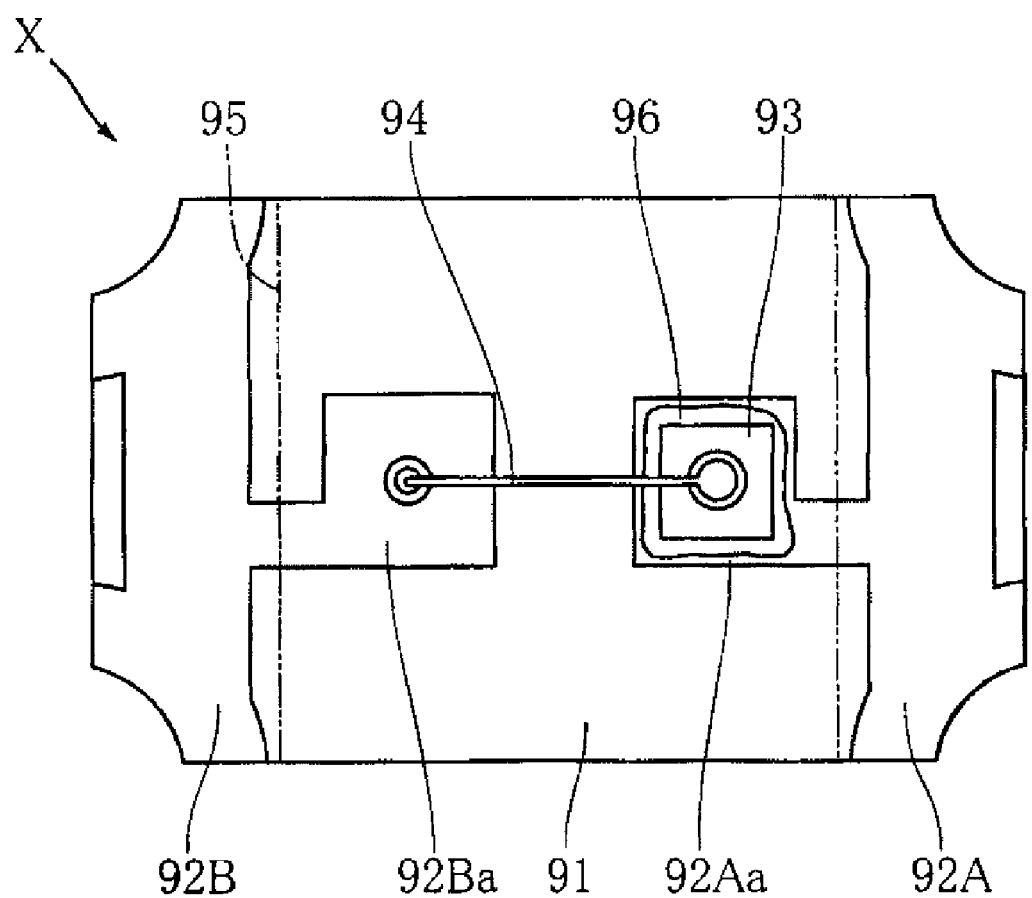
FIG. 5 is a plan view illustrating an example of a conventional semiconductor light emitting device.

FIG. 4 illustrates a semiconductor light emitting device according to a second embodiment of the present invention. In this figure, the elements which are identical or similar to those of the first embodiment are designated by the same reference signs as those used for the first embodiment.

The illustrated semiconductor light emitting device A2 differs from that of the first embodiment in that the electrode 2A is formed with two extensions 21. The extensions 21 extend in a diagonal direction of the LED chip 3. With this embodiment again, the rising of the silver paste 6 onto the LED chip is reliably prevented, so that the thickness reduction of the semiconductor light emitting device A2 is achieved.

The invention claimed is:

1. A semiconductor light emitting device comprising:
a substrate;
an electrode formed on the substrate; and
a semiconductor light emitting element bonded, by electrically conductive paste, to a die bonding pad formed at the electrode, and having a plurality of corners;
wherein at least part of the die bonding pad corresponds in position to a center of the semiconductor light emitting element,
wherein an outer edge of the die bonding pad is positioned on an inner side of an outer edge of the semiconductor light emitting element as viewed in a thickness direction of the substrate,
wherein the electrode is formed with an extension extending from the die bonding pad outward of the semiconductor light emitting element, and
wherein the extension extends on a diagonal line of the semiconductor light emitting element, and at least one corner of the semiconductor light emitting element is located on the extension.

2. The semiconductor light emitting device according to claim 1, wherein the extension comprises two elongated parts extending from the die bonding pad, and each of the two elongated parts corresponds in position to one of two corners of the semiconductor light emitting element, said two corners being diagonally opposite to each other.

3. The semiconductor light emitting device according to claim 1, wherein the electrode has a laminated structure comprising a Cu plating layer, a Ni plating layer and a Au plating layer.

4. The semiconductor light emitting device according to claim 1, wherein the die bonding pad is substantially square, and the extension extends from a corner of the die bonding pad.

5. The semiconductor light emitting device according to claim 1, wherein a ratio of a thickness of the electrically conductive paste to a thickness of the semiconductor light emitting element is in a range of 1:5 to 1:15.

6. The semiconductor light emitting device according to claim 5, wherein the thickness of the electrically conductive paste is in a range of 5 to 7 µm, and the thickness of the semiconductor light emitting element is in a range of 40 to 75 µm.

7. The semiconductor light emitting device according to claim 1, wherein the extension comprises four elongated parts extending from the die bonding pad, and each of the four elongated parts corresponds in position to one of the corners of the semiconductor light emitting element.

8. The semiconductor light emitting device according to claim 7, wherein the electrode is formed with a through-hole located between two elongated parts of the four elongated parts.

9. The semiconductor light emitting device according to claim 1, wherein the semiconductor light emitting element is rectangular, and
   the extension includes a strip portion connected to the die bonding pad and a wide portion connected to an end of the strip portion and having a width larger than a width of the strip portion.

10. The semiconductor light emitting device according to claim 9, wherein the wide portion is rhombic or circular.

11. The semiconductor light emitting device according to claim 9, wherein in the electrode, the wide portion is an extremity connected only to the strip portion.

\* \* \* \* \*